United States Patent
Muthali et al.

(10) Patent No.: US 7,026,883 B2
(45) Date of Patent: Apr. 11, 2006

(54) FEEDBACK LOOP FOR LC VCO

(75) Inventors: Harish Muthali, Portland, OR (US); Ian Young, Portland, OR (US); Joseph F. Ahadian, Carlsbad, CA (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 10/801,395

(22) Filed: Mar. 12, 2004

(65) Prior Publication Data

US 2005/0212611 A1 Sep. 29, 2005

(51) Int. Cl.
*H03B 5/04* (2006.01)
(52) U.S. Cl. .................. 331/183; 331/109; 331/117 R
(58) Field of Classification Search ............... 331/109, 331/117 R, 183
See application file for complete search history.

(56) References Cited

U.S. PATENT DOCUMENTS

| 6,064,277 A * | 5/2000 | Gilbert .................... 331/117 R |
| 6,278,338 B1 * | 8/2001 | Jansson ................ 331/116 FE |
| 6,838,952 B1 * | 1/2005 | Ramet ......................... 331/183 |
| 6,909,336 B1 * | 6/2005 | Rajagopalan et al. ....... 331/183 |
| 2003/0025566 A1 | 2/2003 | Rogers |

* cited by examiner

*Primary Examiner*—Joseph Chang
(74) *Attorney, Agent, or Firm*—Schwabe, Williamson & Wyatt, P.C.

(57) ABSTRACT

A voltage-controlled oscillator includes an inductor capacitor (LC) tank; a drive circuit having a current source; and a feedback loop circuit. The feedback loop includes a peak detect circuit to generate a peak detect voltage; a reference voltage generator to generate a single reference voltage; and an operational amplifier, coupled to the peak detect circuit and the reference voltage generator, to generate an analog bias signal to adjust a current of the current source.

21 Claims, 5 Drawing Sheets

US 7,026,883 B2

FEEDBACK LOOP FOR LC VCO

BACKGROUND OF THE INVENTION

1. Field of the Invention

The present invention relates to electronic devices and systems, and in particular, to oscillators, and devices/systems employing oscillators.

2. Description of Related Art

Many modern electronic devices/systems include oscillators, in particular voltage-controlled oscillators. There are many different types of voltage-controlled oscillators (VCOs), with one type being an inductor-capacitor (LC) oscillator. For very high frequency applications, LC VCOs with frequency stability and superior phase noise performance are desired.

The main components of a LC VCO typically include a differential LC resonant tank or LC tank which includes transistors. The amplitude of the oscillations of the LC tank is affected by Q of the LC tank and the tail current of the LC oscillator. The tail current or the current through the LC tank depends on the bias applied on the gate of the tail current device. Due to process variations, the current (or transconductance) through this tail current device may vary for a fixed bias voltage. Transconductance (gm), in field effect transistors, is the extent to which the drain current (ID) changes in response to a change in the gate-to-source voltage (VGS), which may be expressed as follows: gm=dID/dVGS. Also, the quality factor Q may vary in the LC tank. The quality factor Q is defined as the reactance of the LC tank divided by resistance of the LC tank. If the Q of the LC tank degrades and/or the tail current decreases, the amplitude of oscillations also decreases. Reduction in the amplitude of oscillations will directly impact phase noise/jitter of the LC oscillator. Phase noise is instantaneous variations in the frequency of oscillation as caused by various loss elements, such as resistances which may vary with variations of temperature, load, and processing. Instantaneous variations in the frequency of oscillation may result in phase noise.

DETAILED DESCRIPTION OF AN ILLUSTRATIVE EMBODIMENT

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
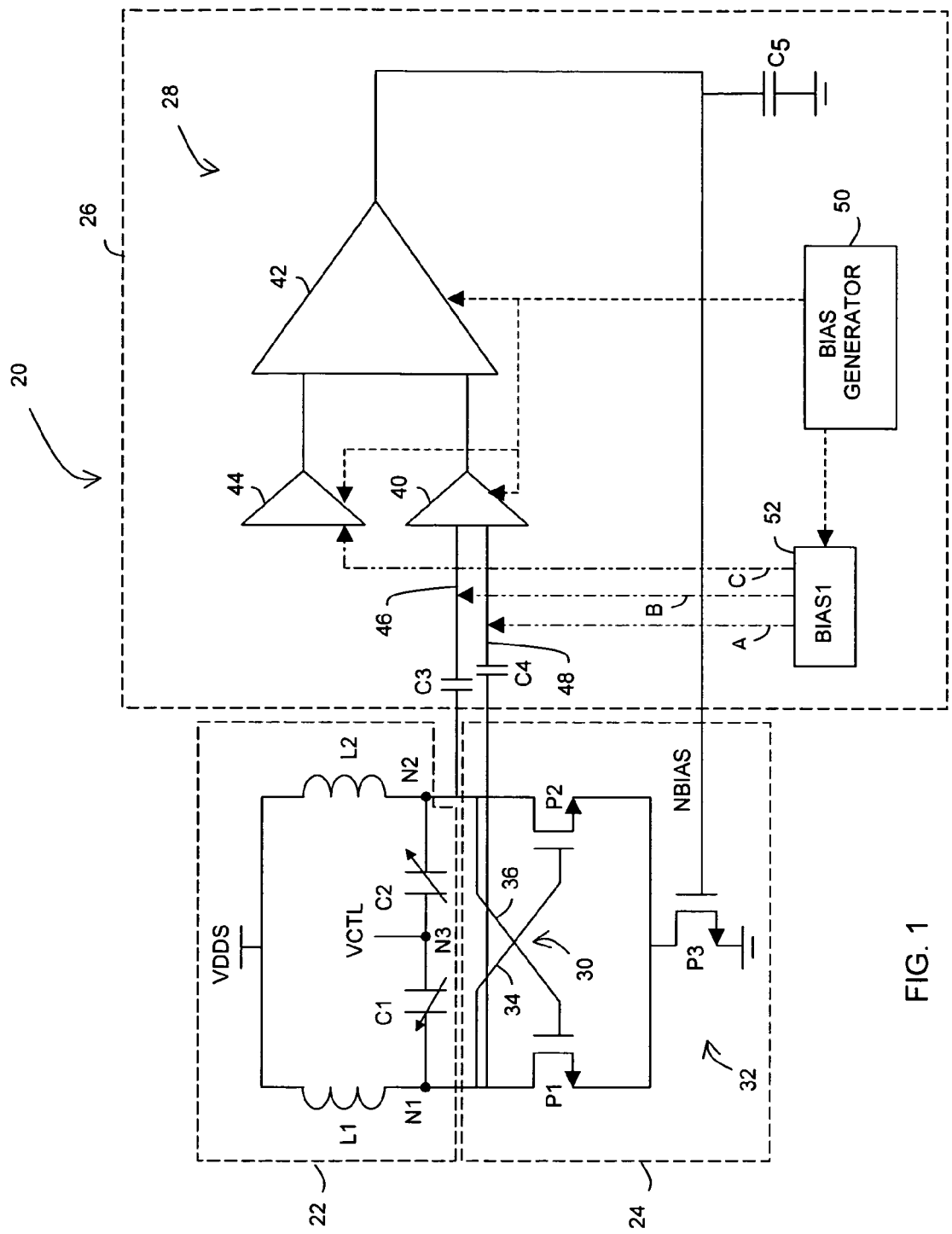
FIG. 1 is a schematic diagram of a LC VCO in accordance with one embodiment of the present invention.

FIG. 1 a schematic diagram of a LC VCO 20 in accordance with one embodiment of the present invention. The LC VCO 20 includes an LC tank 22, a drive circuit 24, and a control circuit 26 in the form of a common mode feedback loop 28. The LC tank 22 may include a pair of variable capacitors (varactors) C1 and C2 and a transformer inductor (center-tap inductor) represented by inductances L1 and L2, with the varactor C1 and inductance L1 forming a first LC resonator and the varactor C2 and inductance L2 forming a second LC resonator. Both the resonators are identical. The transformer inductor has the common terminal connected to the supply VDDS. The other terminal of the inductance L1 may be connected to a node N1 and the other terminal of the inductance L2 may be connected to a node N2. The varactors C1 and C2 may have terminals coupled to the nodes N1 and N2, respectively. The other terminals of varactors C1 and C2 may be commonly coupled at a control node N3, where a control voltage vctl may be provided. The varactors C1 and C2 may be MOS accumulation mode capacitors with their well's coupled together at the control node N3 and with the amount of their capacitance being controlled by the control voltage vctl. In an alternative embodiment, separate inductors may be used for inductance L1 and L2 in place of the transformer inductor with a center tap.

The two nodes N1 and N2 define a pair of tank terminals for the LC tank 22 to which the drive circuit 24 is coupled so that the drive circuit 24 may drive the LC tank 22. The drive circuit 24 includes a negative resistance generator network 30 (also referred to as a "positive feedback network") and a tail current source 32. The generator network 30 may include a pair of transistors P1 and P2. The transistors P1 and P2 may be metal oxide semiconductor field effect transistors (MOSFETs) and in particular may be p-channel, enhancement-type MOSFETS or PMOS transistors; however, they may be any type of transistor. Each of the drains of the transistors P1 and P2 may be coupled to the nodes N1 and N2, respectively. Also, each of the drains of the transistors P1 and P2 may be cross-coupled to the gates of the transistors P2 and P1, respectively, by way of a pair of connectors 34 and 36, respectively. Although not included in the illustrative embodiment of FIG. 1, dc-blocking capacitors may be included in the connectors 34 and 36. The tail current source 32 may include a third transistor P3, which may provide a relatively constant current source. The third transistor P3 may take the form of an enhancement-type PMOS transistor; however, it may be any type of transistor. The transistor P3 may have its drain commonly coupled to the sources of the transistors P1 and P2. The transistor P3 may have its source connected to ground. Additionally, the body biases (not shown) of transistors P1, P2, and P3 may be coupled to ground. The LC VCO 20 may be, for example, a 10 GHz oscillator.

The control circuit 26 is in the form of the common mode feedback loop 28. The feedback loop 28 includes a differential peak detect circuit 40; an operational amplifier (opamp) 42; and a reference voltage generator 44. The opamp 42 may be a folded cascode operational amplifier with high gain-bandwidth. The peak detect circuit 40 may have a pair of input terminals connected to a pair of direct current (DC) blocking capacitors C3 and C4 by a pair of conductors 46 and 48, respectively. The capacitors C3 and C4 may be connected to nodes N1 and N2, respectively. The opamp 42 may have a pair of input terminals connected to the output terminals of the reference voltage generator 44 and the peak detect circuit 40. The output terminal of the opamp 42 is connected to the gate of the transistor P3 so as to provide a nbias voltage signal for biasing the transistor P3 to control the flow of a source current.

The output of the opamp 42 may be connected to a feedback capacitance which provides compensatory capacitance for the opamp 42. Depending on the need, the feedback capacitance may be the combination of a discrete, unique compensation capacitor C5 and the gate capacitance of the transistor P3 or it may be just the gate capacitance of the transistor P3 (the compensation capacitor C5 effectively set at zero). The compensation capacitor C5 is shown coupled between the output node of the opamp 42 and ground. Alternatively, the compensation capacitor C5 may be incorporated into the opamp 42. The size of the compensation capacitor C5 may be selected from a value of zero (resulting in just the gate capacitance as the feedback capacitance) to a small value to compensate for the high bandwidth of the feedback loop 28. The selection of the value of the capacitor C5 is based upon the loop stability. The capacitor C5 may be made to be switchable to be included and to be included in the feedback loop 28.

Figure 5:
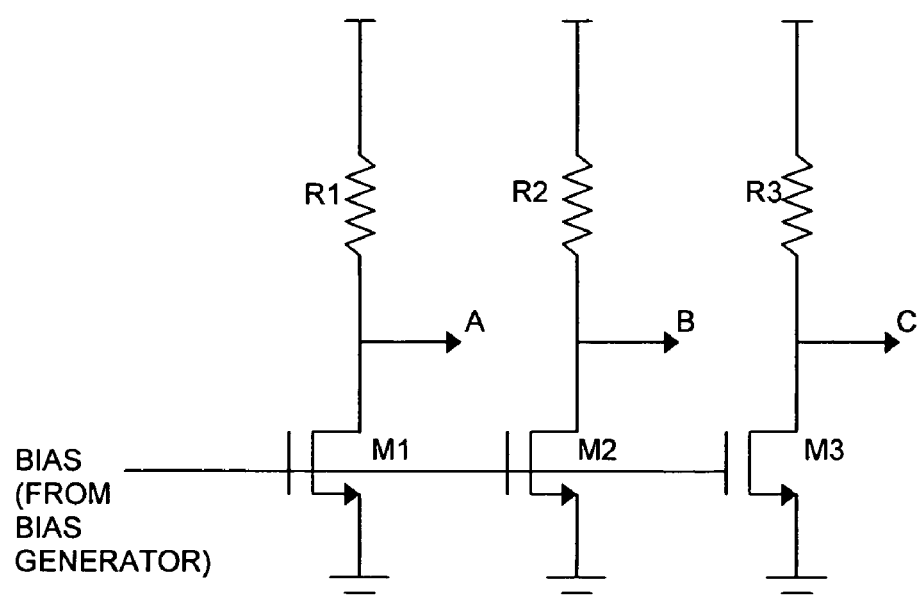
FIG. 5 is a schematic diagram of the bias1 circuit shown in FIG. 1.

A bias generator 50 is coupled to the peak detect circuit 40, the reference voltage generator 44 and the opamp 42 to provide biases for the gates of the transistors. A bias1 circuit 52 may provide bias voltages "A" and "B" to the outputs of the capacitors C3 and C4 on the lines 46 and 48. The bias1 circuit 52 may also provide a bias voltage "C" to the reference voltage generator 44. Referring to FIG. 5, the bias1 circuit 52 is shown in more detail. An NMOS transistor M1 and a resistor R1 are coupled in series between the supply voltage and ground with the bias voltage "A" being generated from a node between the transistor M1 and the resistor R1. An NMOS transistor M2 and a resistor R2 are coupled in series between the supply voltage and ground with the bias voltage "B" being generated from a node between the transistor M2 and the resistor R2. An NMOS transistor M3 and a resistor R3 are coupled in series between the supply voltage and ground with the bias voltage "C" being generated from a node between the transistor M3 and resistor R3. The transistors M1 and M2 are same size devices and the transistors M1 and M3 are ratioed devices. The resistors R1, R2, and R3 have the same value. The gates of the transistors M1, M2 and M3 are biased by voltages from the bias generator 52. The bias voltages "A" and "B" may be the same, and the bias voltage "C" may be a replica voltage derived from the bias voltages a and b. This is why there is a ratio of the transistors M1 and M3.

As to the operation of the LC tank 22 and driver circuit 24 shown in FIGS. 1–5, the LC tank 22 may generate a sinusoidal wave at its resonant frequency. In order to change the resonant frequency, either the inductance L and/or capacitance C of the LC resonators may be changed. The pair of varactors C1 and C2, under control of a control voltage vctl, may be used in a tuning arrangement to control the resonant frequency. The LC tank 22 may be characterized as the load for the drive circuit 24. The drive circuit 24 may provide the necessary energy to start and maintain the oscillations of the passive elements of the LC tank 22, which would otherwise damper out due to having a finite quality factor Q. Hence, the drive circuit 24 amplifies and reinforces the sinusoidal signal of the LC tank 24 via active elements. More specifically, the negative resistance generator network 30 of the drive circuit 24 creates a negative resistance, with the negative resistance offsetting the positive resistance of the LC tank 22 so as to cancel out the losses of LC tank 22. As the LC tank 22 oscillates, the current flow (working current, in direction of electron flow) may originate from the tail current source 32 and then alternately passes through the cross-coupled transistors P1 and P2, which switch between conductive and non-conductive states in coordination with the oscillations of the LC tank 24, thereby reinforcing the oscillations of the LC tank 24. The tail current source 32, in controlling the two cross-coupled transistors P1 and P2 by providing a constant current, aids in controlling the swings of the oscillations of the LC tank 24. A minimum tail current is needed to start the oscillations of the LC tank 24, but too high of a tail current leads to additional phase noise caused by the saturation of the cross-connected transistors P1 and P2.

As to the operation of the common mode feedback loop 28, the capacitors C3 and C4, which are coupled to the nodes N1 and N2, block DC voltages generated by the LC tank 22 at the nodes N1 and N2 and pass the alternating current (AC) voltages, such voltages being representative of the amplitude of oscillations at the nodes N1 and N2. The two lines 46 and 48 or nodes going into the peak detect circuit 40 may be biased at some voltage, which is shown as bias voltages "A" and "B". The AC signals passing though the capacitors C3 and C4 are going ride around (oscillate around) these bias voltages. The three bias voltages A, B, and C may track together. The reference voltage generator 44, with the assistance of the bias1 circuit 52, generates a reference voltage signal. The peak detect circuit 40, which is coupled to the blocking capacitors C3 and C4, generates a peak detect voltage signal. The opamp 42 compares the reference voltage signal and the peak detect voltage signal and generates the nbias voltage signal, which is a bias voltage for the tail current source 32, i.e., the bias voltage for the gate of the transistor P3. If the amplitude of the oscillations are low due to lowered transconductance in the tail transistor P3, then the peak detect voltage signal of the peak detect circuit 40 is low too, which results in the opamp 42 driving the tail current source 32 harder. This results in generating a larger output amplitude swing for the LC tank 22 and therefore a larger output for the VCO 20. Thus, the common mode feedback loop 28 may work to ensure the peak detect voltage signal and the reference voltage signals are equal. This feedback in turn causes the tail current source 32 to generate a tail current of a sufficient magnitude so as to insure that the desired amplitude of oscillation in the LC tank 22. In summary, by obtaining the two differential signals and feeding back an error voltage (nbias signal) from the opamp 42, a substantially constant amplitude of oscillation is achieved by the LC tank 22. This is characterized as "common mode feedback loop" because the feedback loop 28 is feeding back a bias (nbias signal) based on the common mode levels of the two signals (phase and antiphase) obtained from nodes N1 and N2. The opamp 42 may be designed to have high bandwidth, in that a pole generated by the opamp 42 (i.e., poles of the network response function) does not interfere with a pole due to a loop filter when the LC VCO 20 is used in a closed loop, phase lock loop (see FIGS. 6 and 7). In the case where the LC VCO 20 is used in a phase lock loop, the value of the capacitor C5 may be adjusted to insure that the bandwidth of the feedback loop 28 is high enough not to interfere with the pole generated by the loop filter of the phase lock loop.

The common mode feedback loop 28 of the LC VCO 20 ensures a substantially constant voltage swing in the LC tank 12. The feedback loop 28 compensates for any quality factor Q variation in the tank along with any transconductance variation of the tail current source 32 in the LC VCO 20 and of the transistors P1 and P2 in the negative resistance generator network 30. The feedback loop 28 may attenuate any supply noise/ground noise within the bandwidth of the opamp 42. By having constant amplitude of oscillations, the good spectral purity/jitter performance of the VCO 20 is achieved regardless of tank Q degradation and/or change in the trans-conductance of the tail current source 32. Also by keeping the amplitude constant, the tail current will not go out of saturation in case that the Q of the tank 22 is very high. If the Q of the tank 22 is high, the amplitude also is high, i.e., the amplitude is directly proportional to the Q of the tank.

Figure 2:
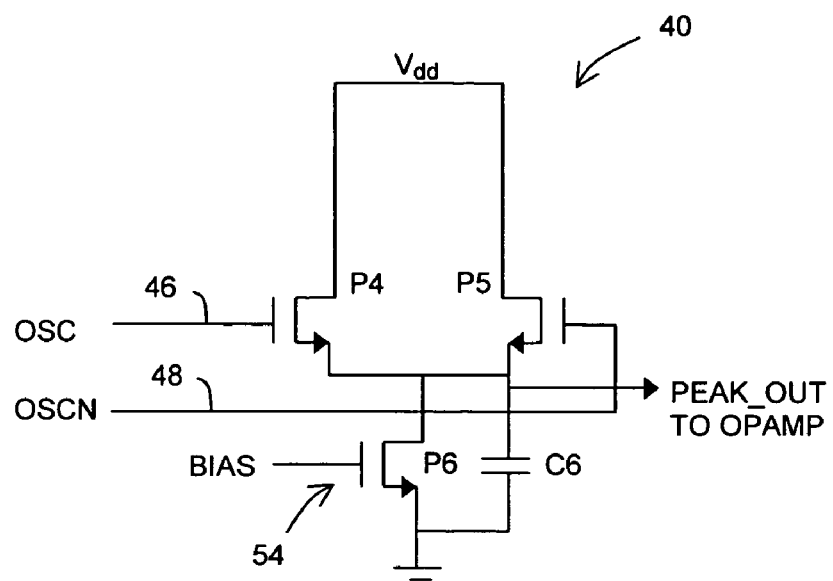
FIG. 2 is a schematic diagram of a differential peak detect circuit shown in FIG. 1.
Figure 4:
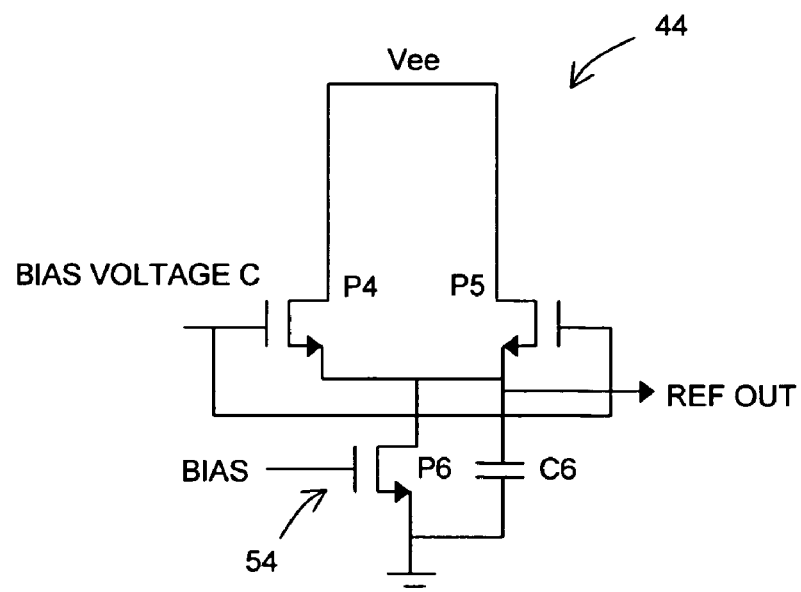
FIG. 4 is a schematic diagram of a reference voltage circuit shown in FIG. 1.

Referring to FIGS. 1, 2, and 4, the peak detect circuit 40 has the same components as the reference voltage generator 44. Hence, descriptions of the components of the peak detect circuit 40 will be modified by "detect" and descriptions of the components of the reference voltage generator 44 will be modified by "reference", so that they may be distinguished in the claims. Likewise, in the claims the term "drive" will be used to modify references to the transistors P1, P2, and P3 of the drive circuit of FIG. 1 (e.g., drive transistor), so as to distinguish the transistors P1, P2, and P3 from the transistors of the peak circuit 40 and voltage reference generator 44. On the other hand, the identical components in FIGS. 2 and 4 are given the same reference number or alphanumeric identified to emphasis that these components are identical.

Figure 3:
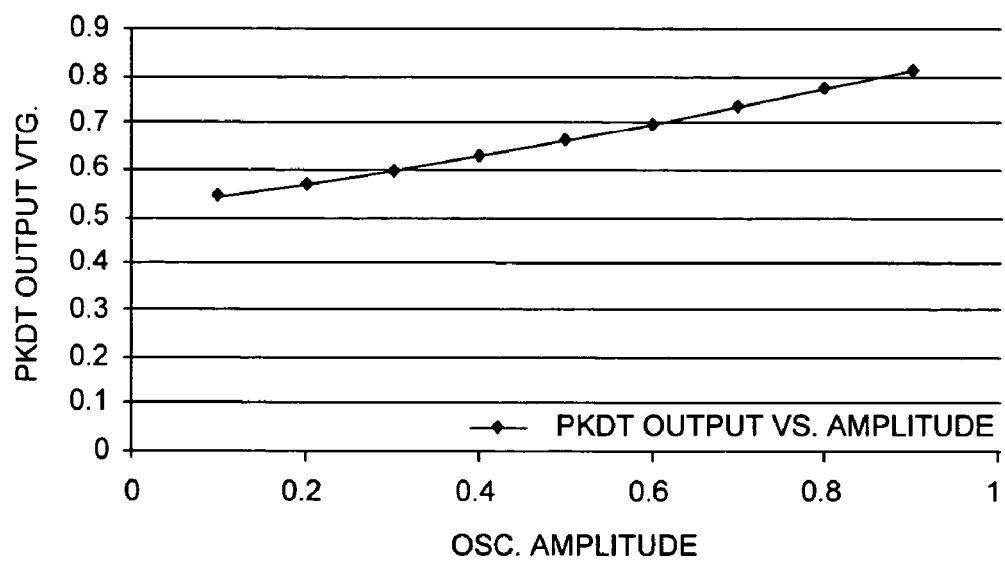
FIG. 3 is a graph of a peak detect voltage output of the differential peak detect circuit of FIGS. 1 and 2 versus the amplitude of an oscillating signal of the LC VCO shown in FIG. 1.

Referring to FIG. 2, the differential peak detect circuit 40 is shown in more detail. The peak detect circuit 40 may be a differential pair device including a pair of detect transistors P4 and P5, which may be biased with a detect tail current source 54. The detect tail current source 54 generates a tail source current for the detect transistors P4 and P5. The detect tail current source 54 may be configured to have a detect transistor P6 with a bias signal being provided to the gate of the detect transistor P6 by the bias generator 50 (shown in FIG. 1). The detect transistors P4, P5 and P6 may be NMOS transistors, but other types of transistors may be used. The detect transistors P4 and P5 have their gates coupled to the conductors 46 and 48, respectively, to receive the voltage signals OSC and OSCN from the blocking capacitors C3 and C4 (shown in FIG. 1), respectively. The drains of the detect transistors P4 and P5 are coupled together to define a common voltage Vdd. The sources of the detect transistors P4 and P5 are commonly coupled to the detect tail current source 54. One terminal of a detect capacitor C6 is coupled to the sources of the detect transistors P4 and P5 and the other terminal is coupled to ground. The other terminal of the current source 54 and the body biases (not shown) of the detect transistors P4 and P5 are coupled to ground. The detect transistors P4 and P5 are driven by the two anti-phase (180 degrees out of phase) voltage signals from the tank 22. The previously-mentioned peak detect voltage signal, which is labeled as peak_out, is extracted from the commonly coupled sources of the detect transistors P4 and P5. The peak_out voltage signal is proportional to the amplitude of oscillations of the LC tank, as illustrated in FIG. 3. Referring to FIG. 3, the response of the peak detect circuit 40 (i.e., the peak detect voltage signal, which labeled as the "peakout" in FIG. 2) versus amplitude of the oscillating signal of the LC tank 22 is shown.

Referring to FIG. 4, the reference voltage generator 44 is shown in more detail. The reference generator 44 may be designed to be a replica of the differential peak detect circuit 40, with the same circuit components. By designing the transistors of the voltage reference generator 44 and peak detect circuit 40 to be the same, it is possible to have tracking between the two, in the sense that process variations may have the same impact on the reference voltage generator 44 and the peak detect circuit 40. The reference voltage generator 44 includes the pair of reference transistors P4 and P5, a reference capacitor C6 and the reference tail current source 54, which includes a reference transistor P6. The transistors and their coupling are identical in FIGS. 2 and 4; hence, a further description will not be repeated for FIG. 4. However, the signal inputs are different between FIGS. 2 and 4. The reference bias voltage "C", provided by the bias1 circuit 52, is applied to both of the gates of the reference transistors P4 and P5. As a result, the reference voltage generator 44 generates the reference voltage signal, labeled as ref_out in FIG. 4. Additionally, the voltage of the commonly coupled drains of the reference transistors P4 and P5 is shown as voltage signal Vee.

Referring to FIG. 1, in summary the common mode feedback loop 28 may be designed to compensate for Q changes in the tank circuit 22 and transconductance of the current source transistor P3. The feedback loop 28 may generate a bias (nbias) for the current source 32 in the VCO 20 such that the amplitude of oscillations in the LC tank 22 may be substantially constant. By maintaining constant amplitude of oscillations, the overall phase noise performance of the VCO is improved. The feedback loop 28 may also serve as a start-up circuit for the LC VCO 22. Hence, the LC VCO 20, in accordance with one embodiment of the invention, addresses one or more of the problems of: amplitude variations in the VCO 20 due to changes in Q factor of the LC tank and process variation resulting in variations in the transconductance of the tail transistor; and phase noise degradation in the LC VCO 20 caused by the previously described factors; and startup of the oscillations in the LC tank 22 after power up.

There are many applications for the LC VCO 20 of FIGS. 1–5 in integrated circuits, such as in phase lock loops (PLLs) for clock recovery in optical communication devices, such as in transceivers compliant with the SONET (Synchronous Optical Network) OC-192 transmission standard and as frequency synthesizers in wireless communication devices.

Figure 6:
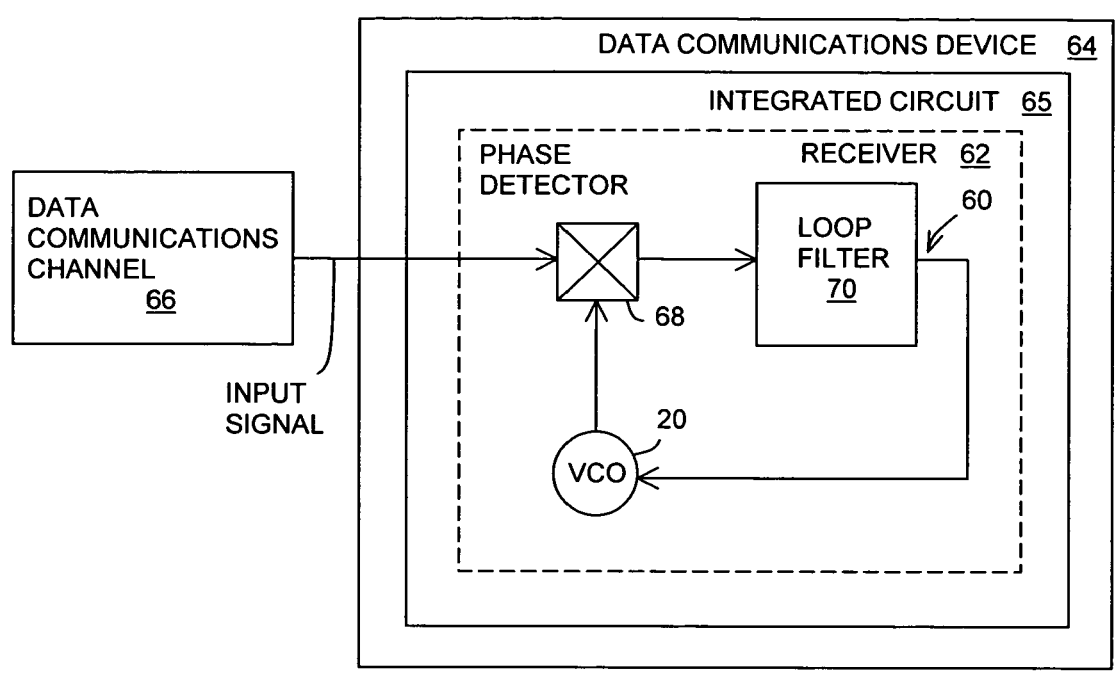
FIG. 6 is a block diagram of an illustrative system having a PLL incorporating the LC VCO according to one embodiment of the present invention.

FIG. 6 includes one of many possible systems in which the LC VCO 20, in accordance with one embodiment of the present invention, may be used. In FIG. 6 the LC VCO 20 may be used in a phase lock loop 60 and more specifically, a phase lock loop used in a receiver 62 of a data communications device 64. The receiver 62 may be implemented in an integrated circuit 65, which may be a application specific integrated circuit (ASIC). The phase lock loop 60 may be used for recovering a clock signal from an input data signal received over a data communications channel 66.

The phase lock loop (PLL) 60 may contain the following components: a phase detector 68 with a first input coupled to the channel 66 for receiving the input signal; a loop filter 70 having an input coupled to the output of the phase detector 68; and the LC VCO 20 having an input coupled to the output of the loop filter 70 and an output coupled to a second input of the phase detector 68. The loop filter 70 may be a low-pass filter. The frequency of the VCO 20 may be controlled by an external control voltage from the loop filter 70. The phase detector 68 compares the phase of the input data signal, which is a periodic signal, against the phase of oscillating signal from the VCO 20. The voltage output of the phase detector 68 is a measure of the difference between its two input signals. The voltage output of the phase detector 68 is filtered by the loop filter and applied as the control voltage to the VCO 20. The control voltage applied to the VCO 20 changes the frequency in a direction that reduces the phase difference between the input signal and the VCO 20. When the loop is "locked," the control voltage is such that the frequency of the VCO 20 is equal to the average frequency of the input signal. Other components of the data communications device 64 may be integrated onto the integrated circuit 65, such as a transmitter.

Figure 7:
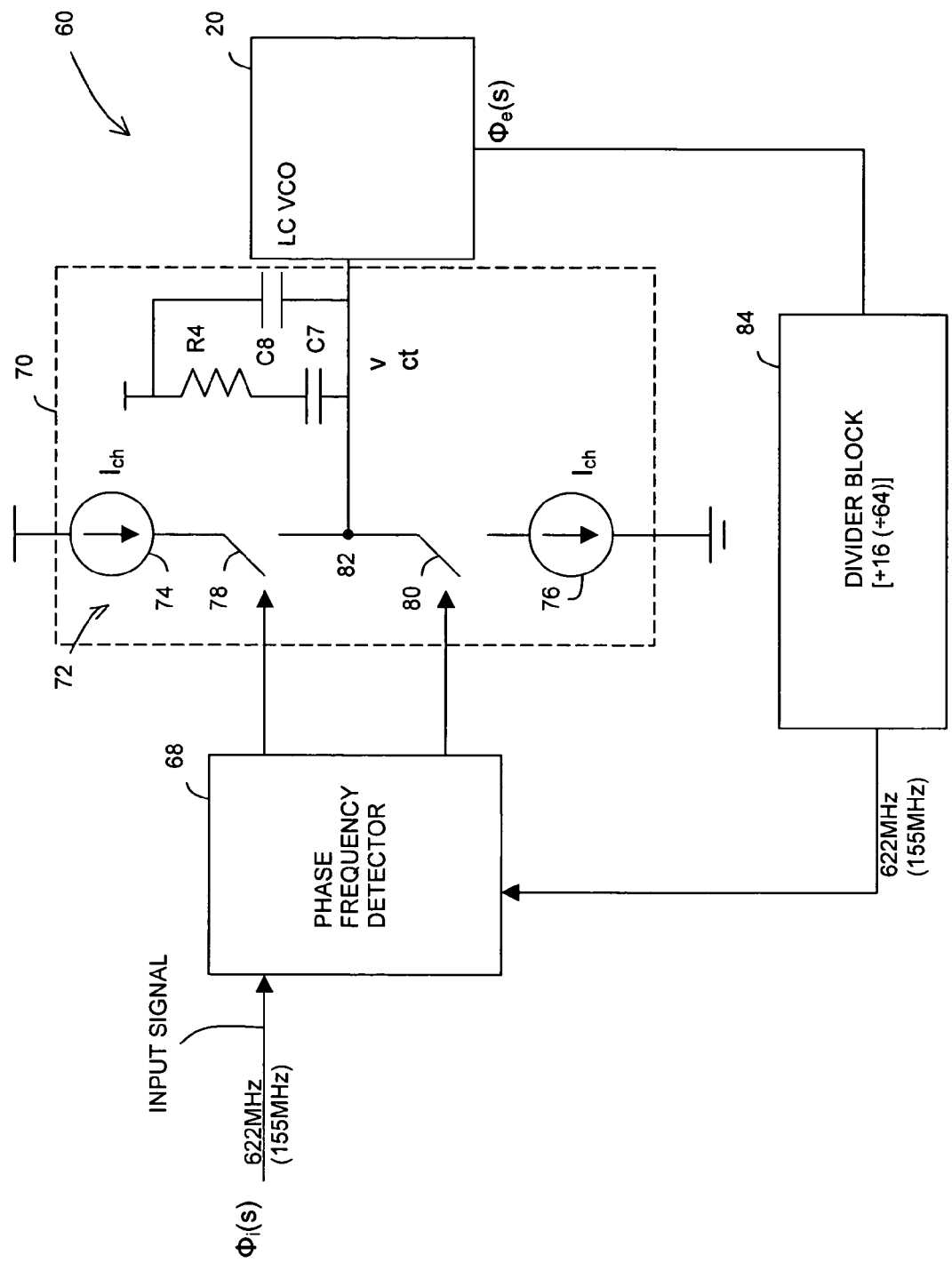
FIG. 7 is a block diagram of an illustrative system having a specific PLL for a SONET system incorporating the LC VCO according to one embodiment of the present invention.

The data communications channel 66, for example, may be a broadband optical-fiber transmissions facility. Moreover, the channel 66 and the receiver 62 may be compatible with the SONET OC-192 transmission standard. FIG. 7 shows the generic PLL 60 of FIG. 6 specifically adapted to for a SONET OC-192 system. The same components retain the same reference numerals in FIG. 7. The Input Signal $\phi_i(s)$ to the phase detector 68 (or phase frequency detector) may have a frequency of 622 MHz or 155 MHz. The loop filter 70 may include a charge pump 72. The charge pump 72 may include a pair of current sources 74 and 76, to generate a current $I_{cp}$, which are coupled to the power supply and ground, respectively. A pair of switches 78 and 80 may be coupled in series between the current sources 74 and 76, with the switches 78 and 80 being activated and deactivated by the phase detector 68. The charge pump 72 charges up the loop filter 70 up and down. A node 82 between the switches 78 and 80 is coupled to the LC VCO 20. A capacitor C7 and a resistor R4 are coupled in series between the node 82 and the power supply and a capacitor C8 is coupled between the node 82 and the power supply. A frequency divider block 84 allows for the two different frequencies 622 MHz and 155 MHz. The common mode feedback loop (see FIG. 1) modifies the transfer function of the LC VCO 20 to:

$$[vctl/\phi_e(s)] = (K_{VCO}/s) * [(1/1 + s/\omega_{p2})]$$

where $\omega_{p2} = (1/R_{out}C_{gg})$, $C_{gg} = C5 +$ gate capacitance of transistor P3 (see FIG. 1); $R_{out}$ is the output impedance of the Opamp stage generating the analog bias for the LC VCO 20 and the C5 is the compensation capacitor required for the opamp. The pole $\omega_{p2}$ is designed to be far away from the 3-dB bandwidth of the PLL 60 due to stability concerns.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   an inductor capacitor (LC) tank;
   a drive circuit including a first generator, coupled to the LC tank, to drive the LC tank, and a current source, coupled to the first generator, to provide a source current to the first generator;
   a feedback loop circuit including a peak detect circuit, coupled to the LC tank, to generate a peak detect voltage signal representing an oscillation amplitude of the LC tank; a reference voltage generator to generate a single reference voltage; and an operational amplifier, with a pair of input terminals coupled to the peak detect circuit and the reference voltage generator and an output terminal coupled to the current source, to compare the peak detect voltage signal and the single reference voltage signal and to generate an analog bias signal in response to a difference between the peak detect voltage signal and the single reference voltage, with the current source being adapted to adjust a magnitude of me source current in response to the analog bias signal;
   the LC tank further including a first tank terminal and a second tank terminal;
   the first generator including a negative resistance generated having a first and a second drive transistor coupled to the first and second tank terminals; the first and second drive transistors having a pair of commonly coupled terminals;
   the current source including a single current source transistor coupled to the commonly coupled terminals to provide the source current to the first and second drive transistors;
   the peak detect circuit including a first detect transistor coupled to the first tank terminal; a second detect transistor coupled to the second tank terminal and the first detect transistor; and a detect current source commonly coupled to the first and second detect transistors;
   the reference voltage circuit including a first reference transistor operable to receive a reference bias signal; a second reference transistor coupled the first reference transistor and operable to receive the reference bias signal; and a reference current source commonly coupled to the first and second reference transistors; and
   the first detect and first reference transistors being identical in design; the second detect and second reference transistors being identical in design; and the detect and reference current sources being identical in design.

2. The apparatus according to claim 1, wherein a capacitor is coupled between the output terminal of the operational amplifier and an electrical ground.

3. The apparatus according to claim 2, wherein the LC tank further comprises a first tank terminal and a second tank terminal; the first generator comprises a negative resistance generator including a first and a second drive transistor coupled to the first and second tank terminals; the first and second drive transistors have a pair of commonly coupled terminals; the current source is a single current source transistor coupled to the commonly coupled terminals to provide the source current to the first and second drive transistors; and the pair of input terminals of the peak detect circuit are coupled to the first and second tank terminals through a first and a second blocking capacitor.

4. The apparatus according to claim 1, wherein a gate of the first detect transistor is coupled to the first tank terminal and a gate of the second detect transistor is coupled to the second tank terminal; a drain of the first detect transistor and a drain of the second detect transistor are commonly coupled; a source of the first detect transistor and a source of the second detect transistor are commonly coupled; and the detect current source is coupled to the commonly coupled sources of the first and second detect transistors and wherein a gate of both the first and second reference transistors is operable to receive the reference bias signal; a drain of the first reference transistor and a drain of the second reference transistor are commonly coupled; a source of the first reference transistor; and a source of the second reference transistor are commonly coupled; and the reference current source is coupled to the commonly coupled sources of the first and second reference transistors.

5. The apparatus according to claim 4, wherein the LC tank has a first and a second LC resonator, the first LC resonator including a first inductance coupled between a supply voltage and the first tank terminal and a first variable capacitor coupled between the first tank terminal and a control node, the second LC resonator including a second inductance coupled between the supply voltage and the second tank terminal and a second variable capacitor coupled between the second tank terminal and the control node, the first drive transistor being coupled to the first tank terminal and cross-coupled the second tank terminal and the second drive transistor being coupled the second tank terminal and cross-coupled to the first tank terminal.

6. The apparatus according to claim 5, wherein the first drive transistor, the second drive transistor, and the current source transistor are MOSFETS; a drain of the first drive transistor is coupled to the first tank terminal; a gate of the first drive transistor is cross-coupled to the drain of the second tank terminal; a drain of the second drive transistor is coupled the second tank terminal; a gate of the second transistor is cross-coupled to the first tank terminal; a source of the first drive transistor and a source of the second drive transistor are commonly coupled to a drain of the current source transistor; a source of the current source transistor is coupled to ground; and a gate of the current source transistor is coupled to the output terminal of the operational amplifier to receive the analog bias signal.

7. The apparatus according to claim 6, wherein the operational amplifier is a folded cascode operational amplifier.

8. The apparatus according to claim 1, wherein a capacitor is coupled between the output terminal of the operational amplifier and an electrical ground.

9. The apparatus according to claim 8, wherein the pair of input terminals of the peak detect circuit are coupled to the first and the second tank terminals through a first and a second blocking capacitor.

10. An apparatus, comprising:
an inductor capacitor (LC) tank having a pair of tank terminals;
a drive circuit including a first and a second drive transistor coupled to the pair of tank terminals and having a pair of commonly coupled terminals, and a single current source transistor, connected to the commonly coupled terminals, to provide a source current to the first and second drive transistors;
a feedback loop circuit including a peak detect circuit, with a pair of input terminals coupled to the pair of tank terminals, to generate a peak detect voltage signal representative of an oscillation amplitude of the LC tank; a reference voltage generator to generate a single reference voltage; and an operational amplifier, with a pair of input terminals coupled to the peak detect circuit and the reference voltage generator and an output terminal coupled to the current source transistor, to compare the peak detect voltage signal and the single reference voltage and to generate an analog bias signal in response to a difference between the peak detect voltage signal and the single reference voltage, with the current source transistor being adapted to adjust a magnitude of the source current in response to the analog bias signal;
the peak detect circuit including a first detect transistor coupled to the first tank terminal; a second detect transistor coupled to the second tank terminal and the first detect transistor; and a detect current source commonly coupled to the first and second detect transistors;
the reference voltage circuit including a first reference transistor operable to receive a reference bias signal; a second reference transistor coupled the first reference transistor and operable to receive the reference bias signal; and a reference current source commonly coupled to the first and second reference transistors; and
the first detect and first reference transistors being identical in design; the second detect and second reference transistors being identical in design; and the detect and reference current sources being identical in design.

11. The apparatus according to claim 10, wherein a compensation capacitor is coupled between the output terminal of the operational amplifier and an electrical ground.

12. The apparatus according to claim 10, wherein the pair of input terminals of the peak detect circuit are coupled to the first and second tank terminals through a first and a second blocking capacitor.

13. The apparatus according to claim 12, wherein the LC tank has a first and a second LC resonator, the first LC resonator including a first inductance coupled between a supply voltage and the first tank terminal and a first variable capacitor coupled between the first tank terminal and a control node, the second LC resonator including a second inductance coupled between the supply voltage and the second tank terminal and a second variable capacitor coupled between the second tank terminal and the control node, the first drive transistor being coupled to the first tank terminal and cross-coupled the second tank terminal and the second drive transistor being coupled the second tank terminal and cross-coupled to the first tank terminal.

14. The apparatus according to claim 13, wherein the first drive transistor, the second drive transistor, and the current source transistor are MOSFETS; a drain of the first drive transistor is coupled to the first tank terminal; a gate of the first drive transistor is cross-coupled to the drain of the second tank terminal; a drain of the second drive transistor is coupled the second tank terminal; a gate of the second transistor is cross-coupled to the first tank terminal; a source of the first drive transistor and a source of the second drive transistor are commonly coupled to a drain of the current source transistor; a source of the current source transistor is coupled to ground; and a gate of the current source transistor is coupled to the output terminal of the operational amplifier to receive the analog bias signal.

15. The apparatus according to claim 10, wherein a gate of the first detect transistor is coupled to the first tank terminal and a gate of the second detect transistor is coupled to the second tank terminal; a drain of the first detect transistor and a drain of the second detect transistor are commonly coupled; a source of the first detect transistor and a source of the second detect transistor are commonly coupled; and the detect current source is coupled to the commonly coupled sources of the first and second detect transistors and wherein a gate of both the first and second reference transistors is operable to receive the reference bias signal; a drain of the first reference transistor and a drain of the second reference transistor are commonly coupled; a source of the first reference transistor; and a source of the second reference transistor are commonly coupled; and the reference current source is coupled to the commonly coupled sources of the first and second reference transistors.

16. The apparatus according to claim 12, wherein the operational amplifier is a folded cascode operational amplifier.

17. The apparatus according to claim 10, wherein the pair of input terminals of the peak detect circuit are coupled to the first and second tank terminals through a first and a second blocking capacitor.

18. A system, comprising an integrated circuit having a receiver, the receiver having a phase lock loop (PLL) to recover a clock signal from a data signal; the PLL including a phase detector with a first input to receive the data signal; a loop filter having an input coupled to the output of the phase detector; and a voltage controlled oscillator (VCO) having an input coupled to the output of the loop filter and an output coupled to a second input of the phase detector; the VCO including an inductor capacitor (LC) tank; a drive circuit including a first generator, coupled to the LC tank, to drive the LC tank and a current source, coupled to the first generator, to provide a source current to the first generator; and a feedback loop circuit including a peak detect circuit, with a pair of input terminals coupled to the LC tank, to generate a peak detect voltage signal representing an oscillation amplitude of the LC tank; a reference voltage generator to generate a single reference voltage; and an operational amplifier, with a pair of input terminals coupled to the peak detect circuit and the reference voltage generator and an output terminal coupled to the current source, to compare the peak detect voltage signal and the single reference voltage and to generate an analog bias signal in response to a difference between the peak detect voltage signal and the single reference voltage, with the current source being adapted to adjust a magnitude of the source current in response to the analog bias signal; the LC tank having a first tank terminal and a second tank terminal; the first generator including a negative resistance generator having a first and a second drive transistor coupled to the first and second tank terminals; the first and second drive transistors having a pair of commonly coupled terminals; the current source comprising a single current source transistor coupled to the commonly coupled terminals to provide the source current to the first and second drive transistors; the peak detect circuit including a first detect transistor coupled to the first tank terminal; a second detect transistor coupled to the second tank terminal and the first detect transistor; and a detect current source commonly coupled to the first and second detect transistors; the reference voltage circuit including a first reference transistor operable to receive a reference bias signal; a second reference transistor coupled the first reference transistor and operable to receive the reference bias signal; and a reference current source commonly coupled to the first and second reference transistors; the first detect and first reference transistors being identical in design; the second detect and second reference transistors being identical in design; and the detect and reference current sources being identical in design.

19. The system of claim 18, further comprising a fiber-optical data communications channel, coupled to the receiver, to provide the data signal to the receiver.

20. The system according to claim 18, wherein a capacitor is coupled between the output terminal of the operational amplifier and an electrical ground.

21. The system according to claim 18, wherein a gate of the first detect transistor is coupled to the first tank terminal and a gate of the second detect transistor is coupled to the second tank terminal; a drain of the first detect transistor and a drain of the second detect transistor are commonly coupled; a source of the first detect transistor and a source of the second detect transistor are commonly coupled; and the detect current source is coupled to the commonly coupled sources of the first and second detect transistors and wherein a gate of both the first and second reference transistors is operable to receive the reference bias signal; a drain of the first reference transistor and a drain of the second reference transistor are commonly coupled; a source of the first reference transistor; and a source of the second reference transistor are commonly coupled; and the reference current source is coupled to the commonly coupled sources of the first and second reference transistors.

* * * * *

UNITED STATES PATENT AND TRADEMARK OFFICE
CERTIFICATE OF CORRECTION

PATENT NO. : 7,026,883 B2  
APPLICATION NO. : 10/801395  
DATED : April 11, 2006  
INVENTOR(S) : Muthali et al.

Page 1 of 2

It is certified that error appears in the above-identified patent and that said Letters Patent is hereby corrected as shown below:

Column 3  
Line 31, "...lines 46 and 48..." should read --...conductors 46 and 48...--.  
Line 49, "...bias generator 52..." should read --...bias generator 50...--.  
Line 53, "...driver circuit 24..." should read --...drive circuit 24...--.  
Line 66, "...LC tank 24..." should read --...LC tank 22...--.

Column 4  
Lines 9, 10, 13 and 14, "...LC tank 24..." should read --...LC tank 22...--.  
Lines 23-24, "...lines 46 and 48..." should read --...conductors 46 and 48...--.  
Line 43, "...VCO 20. ..." should read --...LC VCO 20. ...--.

Column 4 through Column5  
Line 67 -1, "...LC tank 12. ..." should read --...LC tank 22. ...--.

Column 5  
Line 8, "...VCO 20..." should read --...LC VCO 20...--.  
Lines 12 and 13, "...tank 22..." should read --..LC tank 22...--.  
Line 26, "...peak circuit 40..." should read --...peak detect circuit 40...--.  
Lines 26-27, "...voltage reference generator 44..." should read --...reference voltage generator 44...--.  
Line 56, "...tank 22..." should read --...LC tank 22...--.  
Line 60, "...LC tank, ..." should read --...LC tank 22, ...--.  
Line 66, "...reference generator 44..." should read --...reference voltage generator 44...--.

Column 6  
Line 22, "...tank circuit 22..." should read --...LC tank 22...--.  
Lines 24-25, "...VCO 20..." should read --...LC VCO 20...--.  
Line 29, "...LC VCO 22..." should read --...LC VCO 20...--.  
Lines 32, 61, and 65, "...VCO 20..." should read --...LC VCO 20...--.  
Line 33, "...LC tank..." should read --...LC tank 22...--.

Column 7  
Lines 2, 3, 5, and 6, "...VCO 20..." should read --...LC VCO 20...--.

UNITED STATES PATENT AND TRADEMARK OFFICE
CERTIFICATE OF CORRECTION

PATENT NO. : 7,026,883 B2
APPLICATION NO. : 10/801395
DATED : April 11, 2006
INVENTOR(S) : Muthali et al.

It is certified that error appears in the above-identified patent and that said Letters Patent is hereby corrected as shown below:

Column 8
Line 4, "...of me source..." should read --...of the source...--.

Signed and Sealed this

Twelfth Day of June, 2007

JON W. DUDAS
*Director of the United States Patent and Trademark Office*